United States Patent [19]

Bhansali

[11] Patent Number: 5,893,725
[45] Date of Patent: Apr. 13, 1999

[54] C4 SUBSTRATE CONTACT PAD WHICH HAS A LAYER OF NI-B PLATING

[75] Inventor: Ameet Bhansali, Fremont, Calif.

[73] Assignee: Intel Corporation, Santa Clara, Calif.

[21] Appl. No.: 08/946,418

[22] Filed: Oct. 7, 1997

Related U.S. Application Data

[62] Division of application No. 08/669,619, Jun. 24, 1996.

[51] Int. Cl.$^6$ ................................................ H01L 25/04
[52] U.S. Cl. ................................................ 438/108; 257/778
[58] Field of Search .............................. 438/108; 257/778

[56] References Cited

U.S. PATENT DOCUMENTS

| | | |
|---|---|---|
| 3,977,840 | 8/1976 | Estep et al. . |
| 4,323,914 | 4/1982 | Berndlmaier et al. . |
| 4,970,571 | 11/1990 | Yamakawa et al. . |
| 5,066,550 | 11/1991 | Horibe et al. . |
| 5,089,881 | 2/1992 | Panicker . |
| 5,342,806 | 8/1994 | Asahina . |
| 5,436,412 | 7/1995 | Ahmad et al. . |
| 5,468,995 | 11/1995 | Higgins, III . |
| 5,583,073 | 12/1996 | Lin et al. . |

FOREIGN PATENT DOCUMENTS

| | | |
|---|---|---|
| 408306816A | 11/1996 | Japan . |

*Primary Examiner*—Charles Bowers
*Assistant Examiner*—Martin Sulsky
*Attorney, Agent, or Firm*—Blakely, Sokoloff, Taylor & Zafman LLP

[57] ABSTRACT

A flip chip integrated circuit package which has a layer of nickel-boron (Ni—B) on the contact pads of the package substrate and a layer of nickel-phosphorus (Ni—P) on the pins of the substrate. A layer of gold is plated onto the layers of nickel. An integrated circuit with a plurality of solder bumps is placed onto the contact pads of the substrate. The package is heated to reflow the solder bumps, gold and nickel-boron into solder joints that attach the integrated circuit to the substrate. The package is then typically shipped and mounted to a printed circuit board by soldering the pins to the board.

5 Claims, 1 Drawing Sheet

C4 SUBSTRATE CONTACT PAD WHICH HAS A LAYER OF NI-B PLATING

This is a Divisional Application of application Ser. No. 08/669,619, filed Jun. 24, 1996.

BACKGROUND OF THE INVENTION

1. Field of the Invention

The present invention relates to a method for plating an integrated circuit package.

2. Description of Related Art

Integrated circuits are typically protected by a package that is soldered to a printed circuit board. There have been developed various types of packages including gull-wing, pin grid array and a package commonly referred to as "C4" or "flip chip". Flip chip packages include an integrated circuit die that is surface mounted to a substrate of the package. The integrated circuit is provided with a plurality of solder bumps that extend from the die pads of the die. The die and solder bumps are placed onto corresponding contact pads of the substrate. The solder bumps are then reflowed to connect the die pads to the contact pads. Extending from a bottom surface of the substrate are a plurality of pins that can be soldered to the printed circuit board.

The contact pads and pins of the substrate are typically constructed from tungsten and copper material, respectively. A layer of gold is plated onto the pins and pads to inhibit corrosion of the tungsten and copper material. An intermediate layer of nickel-phosphorus (Ni—P) is initially plated onto the copper and tungsten to increase the adhesion of the gold. It has been found that the nickel-phosphorus will create a relatively brittle solder joint at the bump sites of a flip chip package. Brittle solder joints tend to crack and reduce the integrity of the package assembly. It would be desirable to provide a flip chip package which has a more ductile bump solder joint than packages of the prior art.

SUMMARY OF THE INVENTION

The present invention is a flip chip integrated circuit package which has a layer of nickel-boron (Ni—B) on the contact pads of the package substrate and a layer of nickel-phosphorus (Ni—P) on the pins of the substrate. A layer of gold is plated onto the layers of nickel. An integrated circuit with a plurality of solder bumps is placed onto the contact pads of the substrate. The package is heated to reflow the solder bumps, gold and nickel-boron into solder joints that attach the integrated circuit to the substrate. The package is then typically shipped and mounted to a printed circuit board by soldering the pins to the board.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
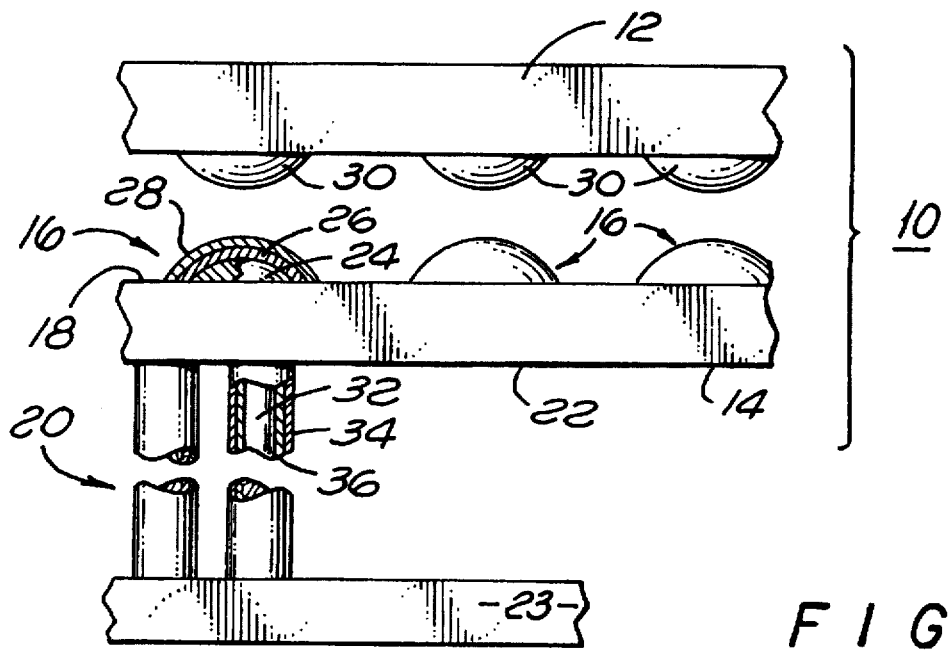
FIG. 1 is a cross-sectional view of an integrated circuit package of the present invention.

Referring to the drawings more particularly by reference numbers, FIG. 1 shows an integrated circuit package 10 of the present invention. The package 10 includes an integrated circuit 12 that is mounted to a substrate 14. The integrated circuit 12 is typically a microprocessor. Although an integrated circuit 12 is shown and described, it is to be understood that the package 10 may contain any electrical device. The substrate 14 is typically constructed from a co-fired ceramic material. Although a co-fired ceramic process is shown and described, it is to be understood that the substrate 14 can be constructed with other processes and materials such as a printed circuit board.

The package 10 has a plurality of contact pads 16 located on a top surface 18 of the substrate 14 and a plurality of pins 20 that extend from a bottom surface 22 of the substrate 14. The substrate 14 typically has a number of vias and routing layers (not shown) that electrically connect the contact pads 16 to the pins 20. In the final assembly the contact pads 16 are soldered to the integrated circuit 12. The pins 20 are connected to an external printed circuit board 23. The substrate 14 provides a conduit to connect the integrated circuit 12 to the printed circuit board 22. The integrated circuit 12 is typically enclosed with an encapsulant (not shown) after the circuit 12 is mounted to the substrate 14.

The contact pads 16 typically have a base 24 that is formed from a tungsten (W) material. The tungsten is covered with a layer of nickel-boron (Ni—B) 26. The Ni—B layer is covered with a layer of gold (Au) 28. The gold layer 28 prevents the oxidation of the Ni—B layer 26. The nickel-boron 26 ensures wetting (adhesion) of the solder to the contact pad.

The integrated circuit 12 has a plurality of solder bumps 30 that extend from die pads of the circuit 12. The solder bumps 30 are placed onto the contact pads 16 of the substrate 14. The package is then heated to reflow the solder, gold and nickel-boron and create a plurality of solder joints that attach the integrated circuit 12 to the substrate 14. It has been found that the nickel-boron plating does not decrease the ductility of the solder joints as much as the nickel-phosphorus plating of the prior art. Although the Ni—B plating has lower adhesion characteristics to Au than Ni—P, the gold melts into the solder joints during the die mounting process so that the lower adhesion of the Ni—B to Au is not a significant factor for the assembled package 10.

The pins 20 are typically constructed from a copper or kovar material 32 which has an outer layer of gold 34. To improve the adhesion of the gold, the pins 20 are provided with an intermediate layer of nickel-phosphorus 36 (Ni—P). The strong adhesive properties of the Ni—P 36 retains the gold and prevents corrosion of the pins 20 during the shipping and subsequent assembly of the package 10.

Figure 2A:
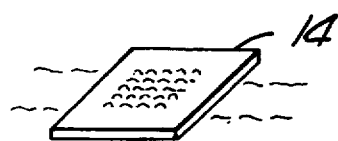
FIG. 2a–j are schematics that show a process for plating a substrate of the package.
Figure 2B:
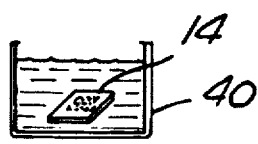

FIGS. 2a–j show a process for plating Ni—B onto the contact pads 16 and Ni—P onto the pins 20. The substrate 14 is typically built with conventional layers of conductive material and ceramic tape and then co-fired as shown in FIG. 2a. The contact pads 16 are formed in the top surface of the substrate 14. As shown in FIG. 2b, the fired substrate 14 is then placed in an electroless bath 40 of Ni—B. The bath plates a layer of Ni—B onto the contact pads 16. In the preferred embodiment, the layer of Ni—B is between 3 and 5 microns thick.

Figure 2C:
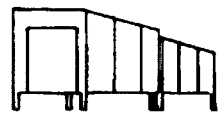
Figure 2D:
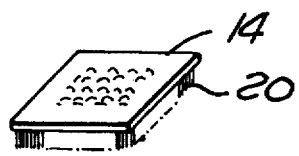
Figure 2E:
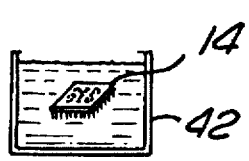
Figure 2F:
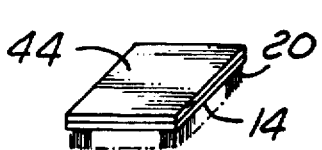
Figure 2G:
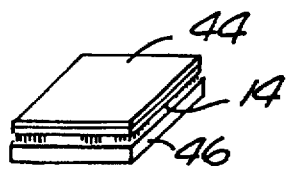
Figure 2H:
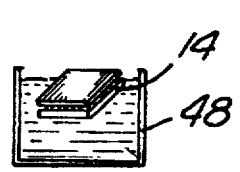

The substrate 14 is sintered and the pins 20 are attached to the bottom surface, typically with a brazing technique, as shown in FIGS. 2c and 2d. As shown in FIG. 2e, the substrate 14 and pins 20 are placed in an electroless bath 42 of gold. The bath 42 plates a layer of gold onto the contact pads 16 and the pins 20. In the preferred embodiment, the layer of gold is between 3 and 12 microns thick. As shown in FIGS. 2f and 2g, the top surface of the substrate 14 is covered with a maskant material 44 and the pins 20 are placed within a tooling jig 46. As shown in FIG. 2h, the masked substrate and jig are placed in an etchant bath 48 that removes the gold from the pins 20.

Figure 2I:
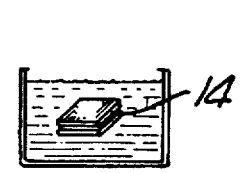
Figure 2J:
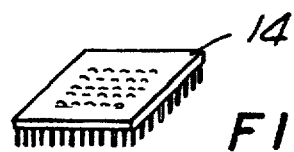

As shown in FIG. 2i, the substrate 14 is placed in electrolytic baths to plate the pins with Ni—P and gold. As shown in FIG. 2j after the plating processes, the mask and jig are removed so that the integrated circuit can be assembled to the substrate 14. Although electroless and electrolytic plating process are shown and described for plating the contact pads 16 and pins 20, respectively, it is to be understood that the process may utilize either electroless or electrolytic baths for any plating process. Electroless plating for the contact pads 16 is preferred because of the reduction in manufacturing cost. The lower adhesion characteristics of electroless plating is not critical for the contact pads, because the Ni—B and Au of the pads is reflowed into the solder joints of the integrated circuit 12. The electrolytic bath is preferred for the pins 20 because of the stronger adhesion characteristics of the electrolytic process. The Ni—P and Au of the pins must withstand the life of the package.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for constructing an integrated circuit package, comprising the steps of:
   a) providing a substrate that has a plurality of contact pads;
   b) plating a layer of nickel-boron onto said contact pads;
   c) attaching a plurality of pins to said substrate;
   d) plating a layer of gold onto said pins and said layer of nickel-boron;
   e) masking said contact pads;
   f) removing said gold from said pins;
   g) plating a layer of nickel-phosphorous to said pins;
   h) plating a layer of gold onto said layer of nickelphosphorous; and,
   i) removing said mask from said contact pads.

2. The method as recited in claim 1, wherein said contact pads are plated with said layer of nickel-boron in an electroless bath.

3. The method as recited in claim 2, wherein said pins are plated with said layer of nickel-phosphorous in an electrolytic bath.

4. The method as recited in claim 3, wherein said pins are brazed to said substrate.

5. The method as recited in claim 1, further comprising the steps of placing an integrated circuit onto said substrate and heating said contact pads so that said nickel-boron and gold reflow to attach said integrated circuit to said substrate.

* * * * *